United States Patent [19]
Brueggemann

[11] 4,387,970
[45] Jun. 14, 1983

[54] PROJECTION LENS ASSEMBLY

[75] Inventor: Harry P. Brueggemann, San Marino, Calif.

[73] Assignee: Xerox Corporation, Stamford, Conn.

[21] Appl. No.: 133,220

[22] Filed: Mar. 24, 1980

[51] Int. Cl.³ .............................. G02B 7/02; G02B 9/64
[52] U.S. Cl. ...................................... 350/463; 350/247
[58] Field of Search ........................ 350/463, 247, 425

[56] References Cited

U.S. PATENT DOCUMENTS

| | | | |
|---|---|---|---|
| 3,359,849 | 12/1967 | Friedman | 350/247 X |
| 3,583,790 | 6/1971 | Baker | 350/247 X |
| 3,617,116 | 11/1971 | Jones | 350/423 X |
| 3,733,115 | 5/1973 | Cox | 350/463 |
| 3,874,771 | 4/1975 | Behrans et al. | 350/463 |
| 4,149,774 | 4/1979 | Hirano et al. | 350/463 X |

OTHER PUBLICATIONS

Harrison, R. W., "Beam Director with Independant Adjustments," *IBM Technical Disclosure Bulletin*, vol. 14, No. 12, pp. 3815–3816, May 1972.

*Primary Examiner*—John K. Corbin
*Assistant Examiner*—Scott J. Sugarman
*Attorney, Agent, or Firm*—Franklyn C. Weiss

[57] ABSTRACT

A projection lens assembly is provided for use in a printed circuit board projection imaging system wherein a reduced image on a glass master is magnified and projected onto a photoresist coated circuit board positioned at a remote location by the assembly. The projection lens comprises eight elements having lens parameters such that the position of a hole in the glass master is projected over the entire 24×18 inch format of the PCB panel with minimum distortion and high optical resolution.

An adjustment technique may be provided to permit adjustment of the distortion of the assembled lens without affecting the other performance parameters of the lens.

6 Claims, 1 Drawing Figure

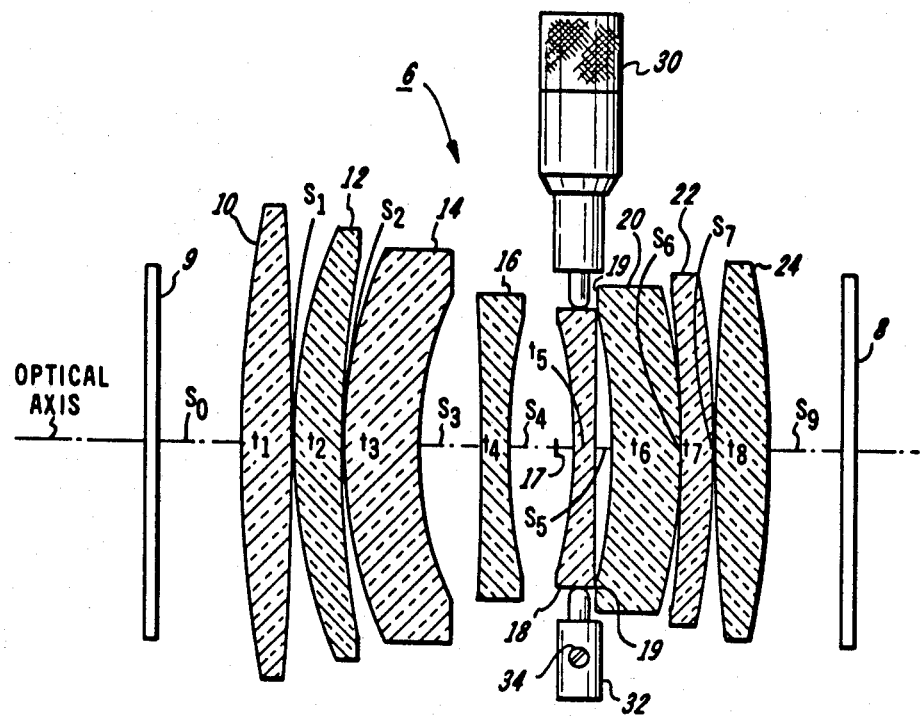

PROJECTION LENS ASSEMBLY

BACKGROUND OF THE INVENTION

The printed circuit board (also known as printed wiring board) is presently and predominantly manufactured employing the contact printing principle.

For a circuit board of moderately complex circuitry and high packing density, the printed circuit board (PCB) is designed with the aid of a computer. Operating in an interactive mode, a design engineer or a layout specialist develops a layout on a computer driven plotter wherein the position and routing of each interconnecting conductor is drawn for the purpose of visual checking and/or design finalization. When the check plot has been reviewed and approved, the circuit pattern is digitized and the coordinates of endpoints of conductors, conductor widths, coordinates of holes, etc., are encoded and stored in memory. A photographic film master is then generated using a computer-controlled precision photo plotter. Additional tooling is also produced for this pattern by the computer in the form of magnetic or paper tapes used to drive drilling machines, board testers and component insertion machines. The function thus described in commonly referred to as computer-aided design.

Manufacturing economy dictates that the PCB's be fabricated in panels with each panel containing multiple circuit boards. For example, a panel 18 inches by 24 inches may consist of six identical circuit boards and in the parlance of the art the panel is designed as six-up. To generate the six-up working film the digital information generated during the computer-aided design phase is employed to drill a bare board for a six-up pattern for use as a tooling panel. Six identical film patterns are then pasted up on the drilled tooling panel and visually registered to insure a perfect alignment between the drilled holes and their corresponding images. A new film master with the multiple PCB pattern is made from the paste-up and rechecked with the drilled tooling panel. The new film master represents a third generation image (second generation if the step-and-repeat operation is done by the photo plotter, an alternative approach if the plotter format is as large as the required panel size).

A large number of working films are then produced from contact prints of the new film master since each working film can only be used approximately 20 times before it is bleached and scratched beyond acceptable performance. This represents a fourth generation of image transcription.

The final transfer of circuit image onto the photoresist is done by manual paste-up and visual registration of the working film onto the predrilled and photoresist-coated panel and finally by exposure of photoresist with an ultraviolet light source. The panel is then developed, plated, etched and committed to further processing. The imaging result obtained by the manual process leaves much to be desired.

It should be clear from the heretofore description that the contact printing process requires, from the original digital information, many generations of image transfer. In each and all the transfer steps, meticulous care must be exercised to control the film dimensional stability through the strict control of ambient temperature and humidity. It requires a large staff in the imaging lab for continually making films.

There are also other problems inherent in the preparation and transcription of circuit image by contact printing. One is the image degradation caused by film wear and worse still the problem of dust and particulate matter pickup during the handling and/or imaging processes. These minute, extraneous materials ultimately show up as electrical shorts or opens on the finished printed circuit boards. A large staff of quality assurance inspectors and touch-up operators is required for constantly examining and repairing the circuit images prior to plating and etching. Despite this, defective PCB's attributed to poor imaging are produced.

What would be desired is to provide an improved PCB manufacturing process wherein substantial cost savings through manufacturing yield improvement by better imaging techniques could be realized; through significant reduction of staff for imaging lab work, inspection and touch-up operations; and through the accumulative savings of materials as a result of improved yields.

SUMMARY OF THE PRESENT INVENTION

The present invention provides a projection lens assembly for projecting an image from multiple circuits formed on a glass master onto a photoresist coated PCB panel. The projection optics precision magnifies the reduced pattern formed on the master to full scale at high optical resolution while maintaining the image-plane light uniformity and is specifically adapted for use in a PCB projection imaging system. An adjustment technique may be provided to permit adjustment of the distortion of the assembled lens without affecting the other performance parameters of the lens.

It is an object of the present invention to provide a novel projection lens assembly for accurately projecting an image, in magnified form, from a master onto a remote substrate sensitive to the projected image light.

It is a further object of the present invention to provide a novel projection lens assembly for projecting an image, in magnified form, from a master onto a remote substrate sensitive to the projected light image, the distortion in the projected image being minimized while the optical resolution of the image on the master is substantially retained in the image projected on the substrate.

BRIEF DESCRIPTION OF THE DRAWING

For a better understanding of the invention as well as other objects and further features thereof, reference is made to the following description which is to be read in conjunction with the following drawing wherein:

The sole FIGURE is an optical diagram of an embodiment of the invention.

DESCRIPTION OF THE PREFERRED EMBODIMENT

Referring now to the drawing, the lens assembly as a whole is designated by the reference number 6, the object plane of the lens assembly 6 is designated by the reference numeral 8 and the image plane of the lens assembly is designated by reference number 9.

As can be seen, lens assembly 6 is made up of a double convex element 10 spaced a distance $S_o$ from image plane 9, a positive meniscus element 12 convex to the front spaced a distance $S_1$ from the rear surface of element 10, a negative meniscus element 14 convex to the front and spaced a distance $S_2$ from the rear surface of element 12, a double concave element 16 spaced a distance $S_3$ from the rear surface of element 14, a planoconcave element 18 spaced a distance $S_4$ from the rear surface of element 16, a positive meniscus element 20 concave to the front in contact with the rear surface of element 18 as shown and spaced a distance $S_5$ from the rear surface of element 18, a positive meniscus element 22 concave to the front and spaced a distance $S_6$ from the rear surface of element 20 and a double convex element 24 spaced a distance $S_7$ from the rear surface of element 22, element 24 being spaced a distance $S_8$ from object plane 8.

The following chart I is an example of constructional data for the preferred embodiment of the present invention.

CHART I

| Lens | Radius | Thickness | Spacing | Glass |
|---|---|---|---|---|
| 10 | $R_1 = 7.3265$ | $t_1 = 0.355$ | $S_0 = 70.3844$ | Quartz |
|  | $R_2 = -22.4810$ |  |  |  |
|  |  |  | $S_1 = 0.0100$ |  |
| 12 | $R_3 = 3.5895$ | $t_2 = 0.2964$ |  | Quartz |
|  | $R_4 = 6.5000$ |  |  |  |
|  |  |  | $S_2 = 0.0142$ |  |
| 14 | $R_5 = 2.9760$ | $t_3 = 0.4958$ |  | Quartz |
|  | $R_6 = 2.3935$ |  |  |  |
|  |  |  | $S_3 = 0.3919$ |  |
| 16 | $R_7 = -15.4387$ | $t_4 = 0.2000$ |  | LF5 |
|  | $R_8 = 4.7949$ |  |  |  |
|  |  |  | $S_4 = 0.3939$ |  |
| 18 | $R_9 = -3.3488$ | $t_5 = 0.1500$ |  | Quartz |
|  | $R_{10}$ = Infinite(Plano) |  | $S_5 = 0.0728$ |  |
| 20 | $R_{11} = -5.5690$ | $t_6 = 0.4560$ |  | Quartz |
|  | $R_{12} = -4.3117$ |  |  |  |
|  |  |  | $S_6 = 0.0100$ |  |
| 22 | $R_{13} = -10.5652$ | $t_7 = 0.2322$ |  | Quartz |
|  | $R_{14} = -5.3070$ |  |  |  |
|  |  |  | $S_7 = 0.0100$ |  |
| 24 | $R_{15} = 12.1492$ | $t_8 = 0.3522$ |  | Quartz |
|  | $R_{16} = -5.1078$ |  |  |  |
|  |  |  | $S_8 = 16.1812$ |  |

Note:
F.O.V. = $4\frac{1}{2} \times 6''$ at object plane 8. F/Number = f/9.0
Magnification = 4
EFL = 14.4
Aperture Stop Position 0.1036 from in front surface of element 18.
Index of Refraction at 365 nanometers (i line):
Quartz 1.474553;
LF5 1.619080. All dimensions in inches.

In the chart the radii of curvature R, the thickness of the elements and the spacings S, are all expressed in their customary manner.

The aforementioned projection lens assembly design is particularly adaptable for use in a PCB projection imaging system wherein the magnified image distortion is minimized while image resolution remains high.

In the preferred embodiment, magnification is approximately 4, the system operates in and is achromatic over the wavelength range from about 360 nanometers to about 370 nanometers, the f/number is 9.0 in the object space and 36 at the image space over the operating wavelength range and the field of view is $18'' \times 24''$ at the image plane and $4\frac{1}{2} \times 6''$ at the object plane.

The reason for the choice of quartz is its low energy absorption at 365 nanometers and its low thermal expansion (thermal environment in the system in where the lens assembly is utilized is relatively severe). In color correction, a different material is needed. LF5 was chosen for that reason and also because of its relatively low energy absorption.

In a PCB projection imaging system wherein system tolerance is maintained very tightly such that the distortion of the projected image is maintained within acceptable limits, adjusting the lens assembly is not required. However, if such adjustment is necessary, the present invention provides a technique for reducing lens tilt distortion further without substantially affecting the optical resolution of the lens assembly. In this regard, tilting the front surface of element 18 (the first surface after the aperture stop 17) has a strong effect on decentered distortion without appreciably affecting other parameters. Decentered distortion exists in only one direction, the direction of tilt, and has little effect on distortion at 90° to the direction of tilt. This is the kind of distortion which is likely to occur because of fabrication and assembly errors, since the distortion will arise primarily from tilt errors.

Tilting the front surface as a means to adjust fabrication tilt errors is not practical, since the tilt angle cannot be controlled accurately enough to provide fine tuning of distortion. Further, tilting the front surface would also tilt the rear surface of element 18 and would complicate the analysis of the adjustment.

However, it has been discovered that a lateral displacement of element 18, parallel to its rear surface, has the effect of tilting its front surface without tilting the rear surface. A micrometer 30 working against a spring load 32 may be utilized to provide lateral adjustments to an accuracy of a micron, so the tilt of the front surface of element 18 can be controlled to the accuracy required.

Micrometer 30 and opposing spring load 32 act at right angles to the optical axis on the optical element 18. This element is bounded by a curved front surface and a flat rear surface thereon which bears against a flat surface 19 which is ground on the front surface of the element 20 outside the clear aperture thereof. To tilt the front surface about an axis normal to the paper, the micrometer head is twisted, which causes the element 18 to slide across the flat surface on element 20. The amount of travel to impart to the micrometer may be calculated from distortion measurements.

A fabrication or assembly error may produce a tilt in the plane of the paper in the FIGURE, or out of the plane of the paper, or at any unknown angle in between. This tilt can be broken down into two components, one in the plane of the paper, and one out of the plane of the paper, at 90° to the paper. All tilt components in the plane of the paper, from all surfaces and elements, can be added to one component in that plane, and all tilt components out of the plane of the paper can be added to one component in that plane. Thus at the image surface there are only two tilt components, one a summation of all the tilts in the plane of the paper, and the other a summation of all the tilts out of the plane of the paper.

A micrometer and spring load that operates out of the plane of the paper is not shown for purposes of convenience. The distortion due to tilts in the plane of the paper are removed by a single adjustment of the micrometer 30 and the distortion due to tilts out of the plane of the paper are removed by a single adjustment of the micrometer not shown out of the plane of the paper.

After the adjustments are made, both micrometers are locked by set screws (set screw 34 for spring load 32) so that the adjustments do not change.

While the invention has been described with reference to its preferred embodiment, it will be understood by those skilled in the art that various changes may be made and equivalents substituted for elements thereof without departing from the true spirit and scope of the invention. In addition, many modifications may be made to adapt a particular situation or material to the teachings of the invention without departing from its essential teachings.

What is claimed is:

1. A projection lens assembly along an optical axis from front to rear comprising a double convex element, a first positive meniscus element convex to the front, a negative meniscus element convex to the front, a double concave element, a plano-concave element, a second positive meniscus element concave to the front, a third positive meniscus element concave to the front, and a double convex element.

2. A projection lens assembly made substantially according to the following chart of constructional data

| Lens | Radius | Thickness | Spacing | Glass |
|---|---|---|---|---|
| 10 | $R_1 = 7.3265$ | | | |
| | | $t_1 = 0.355$ | $S_0 = 70.3844$ | Quartz |
| | $R_2 = -22.4810$ | | | |
| | | | $S_1 = 0.0100$ | |
| 12 | $R_3 = 3.5895$ | | | |
| | | $t_2 = 0.2964$ | | Quartz |
| | $R_4 = 6.5000$ | | | |
| | | | $S_2 = 0.0142$ | |
| 14 | $R_5 = 2.9760$ | | | |
| | | $t_3 = 0.4958$ | | Quartz |
| | $R_6 = 2.3935$ | | | |
| | | | $S_3 = 0.3919$ | |
| 16 | $R_7 = -15.4387$ | | | |
| | | $t_4 = 0.2000$ | | LF5 |
| | $R_8 = 4.7949$ | | | |
| | | | $S_4 = 0.3939$ | |
| 18 | $R_9 = -3.3488$ | $t_5 = 0.1500$ | | Quartz |
| | $R_{10} = $ Infinite(Plano) | | | |
| | | | $S_5 = 0.0728$ | |
| 20 | $R_{11} = -5.5690$ | | | |
| | | $t_6 = 0.4560$ | | Quartz |
| | $R_{12} = -4.3117$ | | | |
| | | | $S_6 = 0.0100$ | |
| 22 | $R_{13} = -10.5652$ | | | |
| | | $t_7 = 0.2322$ | | Quartz |
| | $R_{14} = -5.3070$ | | | |

-continued

| Lens | Radius | Thickness | Spacing | Glass |
|---|---|---|---|---|
| | | | $S_7 = 0.0100$ | - |
| 24 | $R_{15} = 12.1492$ | | | |
| | | $t_8 = 0.3522$ | | Quartz |
| | $R_{16} = -5.1078$ | | | |
| | | | $S_8 = 16.1812$ | |

Note:
F.O.V. = 4¼ × 6″ at object plane 8 F/Number = f/9.0
Magnification = 4
EFL = 14.4
Aperture Stop Position 0.1036 from in front surface of element 18
Index of Refraction at 365 nanometers (i line):
Quartz: 1.474553;
LF5 1.619080 All dimensions in inches.

3. The projection lens assembly as defined in claim 1 further including means for moving said plano-concave element along a predetermined plane perpendicular to the optical axis whereby image distortion produced by said projection lens assembly is minimized.

4. The projection lens assembly as defined in claim 3 wherein the plano surface of said plano-concave element bears against a flat surface of said second positive meniscus element outside the clear aperture thereof.

5. The projection lens assembly as defined in claim 3 wherein said moving means comprises micrometer adjustment means on one edge of said plano-concave element,
spring load means on the opposite side of the plano-concave element on the edge thereof to oppose the opposing force of said micrometer adjustment means, wherein adjustment of said micrometer adjustment means causes the plano-concave element to move in said predetermined plane.

6. The apparatus as set forth in claim 5 wherein said micrometer adjustment means and opposing spring load means include
a first micrometer and first opposing spring load for moving said plano-concave element along a first axis and a second micrometer and second opposing spring load means for moving said plano-concave element along a second axis, said first axis and second axis defining said predetermined plane and are displaced by ninety degrees.

* * * * *